United States Patent [19]

Wellnitz et al.

[11] Patent Number: 5,581,432
[45] Date of Patent: Dec. 3, 1996

[54] CLAMP CIRCUIT AND METHOD FOR IDENTIFYING A SAFE OPERATING AREA

[75] Inventors: Keith M. Wellnitz, Chandler; John M. Hargedon, Tempe; Jeffrey A. Kanner, Phoenix, all of Ariz.

[73] Assignee: Motorola, Inc., Schaumburg, Ill.

[21] Appl. No.: 506,799

[22] Filed: Jul. 25, 1995

[51] Int. Cl.[6] .................................................. H02H 9/00
[52] U.S. Cl. ........................... 361/56; 361/111; 361/18; 324/523; 324/769
[58] Field of Search .............................. 361/56, 58, 91, 361/101, 111, 93, 18, 54; 324/522, 523, 527, 765, 768, 769; 257/355–363

[56] References Cited

U.S. PATENT DOCUMENTS

| | | | |
|---|---|---|---|
| 4,860,152 | 8/1989 | Osborn | 361/91 |
| 5,005,061 | 4/1991 | Robb et al. | 257/262 |
| 5,079,608 | 1/1992 | Wodarczyk et al. | 255/355 |
| 5,115,369 | 5/1992 | Robb et al. | 361/93 |
| 5,132,866 | 7/1992 | Raciti et al. | 361/56 |
| 5,365,099 | 11/1994 | Phipps et al. | 257/328 |
| 5,381,105 | 1/1995 | Phipps | 324/765 |

*Primary Examiner*—Jeffrey A. Gaffin
*Assistant Examiner*—Michael J. Sherry
*Attorney, Agent, or Firm*—Rennie William Dover

[57] ABSTRACT

A clamp circuit (10) for protecting a MOSFET (12) from destructive voltages and currents includes a clamping element (30), a current switch (27), a bond pad (23), a probe pad (25), and a resistor (21). When no external signal is applied to the probe pad (25), a FET (18) in the clamping element (30) is conductive. When the drain voltage of the MOSFET (12) rises above a clamping voltage of the clamping element (30), a current flows through the clamping element (30) and switches on the MOSFET (12). To ensure a safe operating area of the MOSFET (12), a voltage is applied to the probe pad (25) to turn off the FET (18), a breakdown voltage of the MOSFET (12) measured from the bond pad (23) is compared with the clamp voltage, and circuit die with the breakdown voltage less than the clamp voltage are discarded.

15 Claims, 2 Drawing Sheets

CLAMP CIRCUIT AND METHOD FOR IDENTIFYING A SAFE OPERATING AREA

BACKGROUND OF THE INVENTION

The present invention relates, in general, to protecting semiconductor devices, and more particularly, to protecting semiconductor devices using clamp circuits.

Power semiconductor devices are used in high power applications in areas such as automotive electronics, machine automation, and the like. For example, a power semiconductor device such as a power metal oxide semiconductor field effect transistor (MOSFET) is frequently used to switch an inductive load. When the power MOSFET is switched off, the inductive energy stored in the inductive load can raise the drain voltage of the power MOSFET above the supply voltage. If no protection for the power MOSFET is provided, the drain voltage of the power MOSFET will continue to rise until it exceeds the drain-source avalanche voltage, leading to conduction in an internal parasitic bipolar transistor and causing an avalanche stress induced failure of the power MOSFET.

One method for protecting the power MOSFET against the avalanche stress induced failure is to divert a small portion of the inductive energy to the gate of the power MOSFET through a drain-gate clamp diode having an avalanche voltage slightly less than the avalanche voltage of the power MOSFET. A resistor is placed between the gate and source of the power MOSFET to dissipate any leakage current through the drain-gate clamp diode without activating the power MOSFET. A blocking diode is usually placed in series with the drain-gate clamp diode to block current from a gate signal source to the drain of the power MOSFET. When the drain-source voltage of the power MOSFET rises above the avalanche voltage of the drain-gate clamp diode, a current flows through the clamp diode, which activates the power MOSFET by developing a voltage across the resistor. The power MOSFET is turned on and dissipates all of the inductive energy. Thus, the power MOSFET dissipates the inductive energy in a less stressful conduction mode. Another method for protecting the power MOSFET is to place a clamp diode between the drain and source of the power MOSFET, wherein the avalanche voltage of the clamp diode is slightly less than that of the power MOSFET. The inductive energy is dissipated through the clamp diode instead of the power MOSFET when the drain-source voltage rises above the avalanche voltage of the drain-source clamp diode.

The avalanche voltage of the clamp diode determines the rate at which the inductive energy is dissipated. To achieve a high switching speed and protect the power MOSFET, it is desirable to set the clamp diode avalanche voltage ($V_{clamp}$) as closely below the power MOSFET avalanche voltage ($BV_{dss}$) as possible. Because $BV_{dss}$ is not measurable with the drain-gate clamp diode or the drain-source clamp diode intact, process control data are typically used to infer $BV_{dss}$. However, this approach has been proven unreliable at guaranteeing $V_{clamp} < BV_{dss}$ because of the temperature, process, and geometric variations in the power MOSFET.

Other approaches include the separate wire bond approach and the split pad approach. The separate wire bond approach uses a clamp bond pad and a drain bond pad connected to the clamp diode and the drain of the power MOSFET, respectively. $V_{clamp}$ and $BV_{dss}$ are measured using the two separate pads to ensure $V_{clamp} < BV_{dss}$. Afterwards, the two bond pads are wired to the same post to complete the circuit. The split pad approach combines the clamp bond pad and the drain bond pad into a split pad. $V_{clamp}$ is measured using the clamp section of the split pad and $BV_{dss}$ is measured using the drain section of the split pad. After $V_{clamp} < BV_{dss}$ is ensured, the two sections of the split pad are wire bonded to form a single pad to complete the circuit. For both of these approaches, additional processing steps are required to complete the circuit after the measurement of $V_{clamp}$ and $BV_{dss}$, and the transistor is vulnerable to electrostatic discharge (ESD) because the clamp is not active before completing the circuit. Furthermore, the separate wire bond approach requires more area and increases the manufacturing complexity.

Accordingly, it would be advantageous to have a clamp circuit for which $V_{clamp}$ and $BV_{dss}$ can be measured with the clamp intact to ensure protection at all times. It would be of further advantage for the clamp circuit to be area efficient and easy to manufacture.

DETAILED DESCRIPTION OF THE DRAWINGS

Generally, the present invention provides a clamp circuit and a method for using the clamp circuit to protect a transistor against destructive voltages and currents. More particularly, the present invention provides a method for measuring the clamp voltage ($V_{clamp}$) and the transistor breakdown voltage ($BV_{dss}$), thereby ensuring that the clamp circuit is operating in a safe operating area of the transistor, wherein the safe operating area is characterized by $V_{clamp} < BV_{dss}$.

Figure 1:
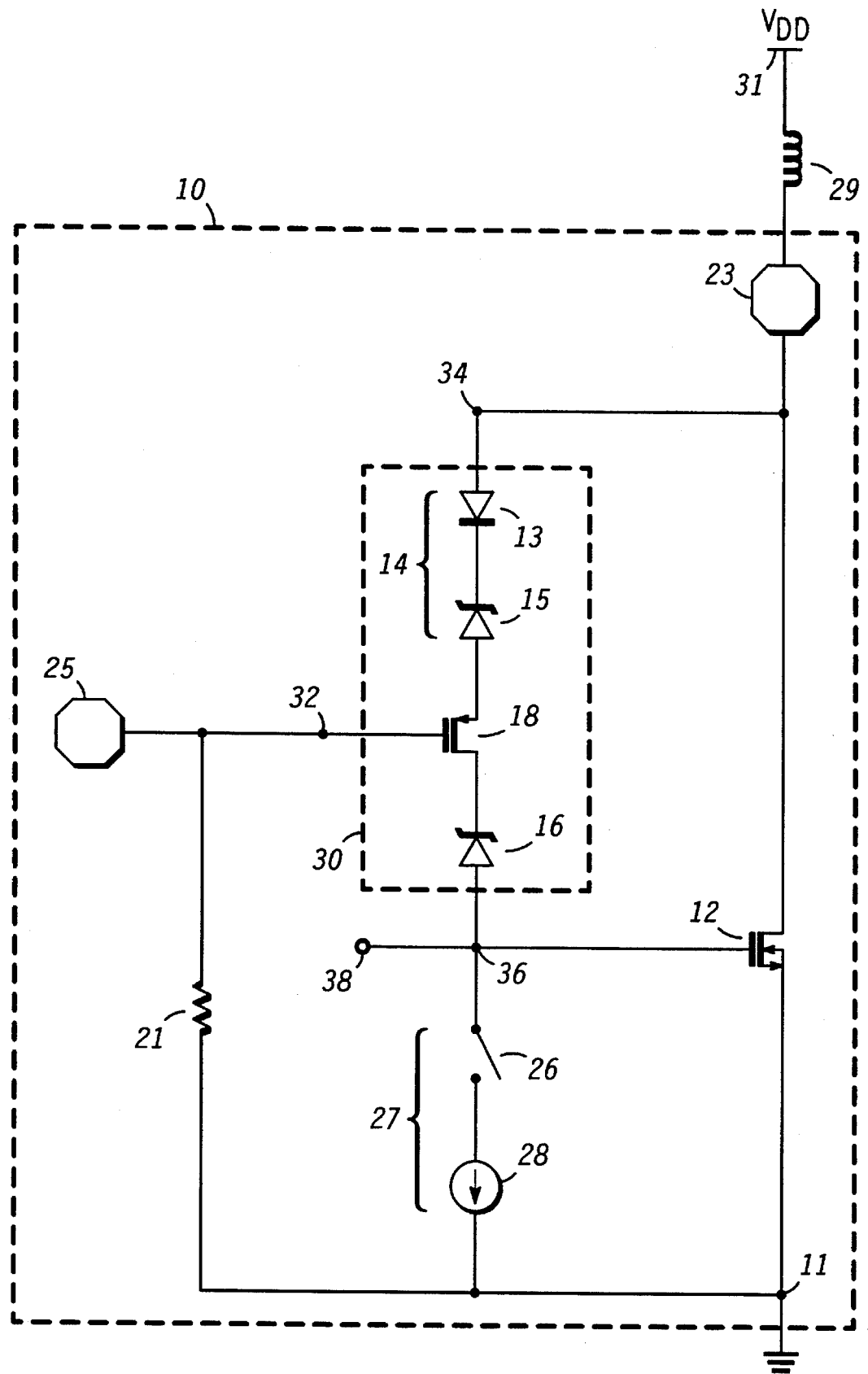
FIG. 1 illustrates a schematic diagram of a clamp circuit in accordance with a first embodiment of the present invention.

FIG. 1 illustrates a schematic diagram of a clamp circuit 10 suitable for manufacture using semiconductor processing techniques in accordance with a first embodiment of the present invention. Clamp circuit 10 includes a power metal oxide semiconductor field effect transistor (MOSFET) 12, having a gate electrode coupled for receiving a control signal at a node 38, a source electrode connected to a node 11 for receiving a reference potential and a drain electrode connected to a bond pad 23. By way of example, the reference potential at node 11 is a ground potential. The gate electrode of power MOSFET 12 is further coupled to node 11 via a current switch 27. Current switch 27 includes a series combination of a switch 26 and a current source 28, both of which can be field effect transistors.

Clamp circuit 10 further includes a clamping element 30, having a first clamping terminal 34 connected to bond pad 23, a second clamping terminal 36 connected to the gate electrode of power MOSFET 12, and a control terminal 32 connected to a probe pad 25. The control terminal of clamping element 30 is further coupled to node 11 via a resistor 21. Clamping element 30 includes a diode combination 14, a p-channel enhancement mode insulated gate field effect transistor (FET) 18 serving as a switch, and a Zener diode 16. Diode element 14 includes a blocking diode 13 having an anode electrode serving as first clamping terminal 34 of clamping element 30, and a Zener diode 15 having a cathode electrode connected to a cathode electrode of blocking diode 13 and an anode electrode connected to a source electrode of FET 18. A gate electrode of FET 18 serves as control terminal 32 of clamping element 30. Zener diode 16 has a cathode electrode connected to a drain electrode of FET 18 and an anode electrode serving as second clamping terminal 36 of clamping element 30. Although FIG. 1 illustrates diode combination 14 as having one blocking diode 13 and one Zener diode 15, it should be noted that diode combination 14 can include any number of blocking diodes and Zener diodes. Likewise, any number of diodes can be inserted between the drain electrode of FET 18 and second clamping terminal 36. The number of diodes between the drain electrode of FET 18 and second clamping terminal 36 depends on the gate-source breakdown voltage of FET 18. The Zener and blocking diodes between first clamping terminal 34 and second clamping terminal 36 are oriented so that the current flows from the cathode electrode to the anode electrode of the Zener diode and from the anode electrode to the cathode electrode of the blocking diode when the clamp is activated. In addition, FET 18 is not limited to being a p-channel device. FET 18 can be replaced by any three terminal switching device which is in a conductive state when probe pad 25 does not receive any signal.

The present invention is not limited to providing protection for a power MOSFET as depicted in FIG. 1. Power MOSFET 12 in clamp circuit 10 can be replaced by, for example, a bipolar transistor, an insulated gate bipolar transistor, a metal semiconductor field effect transistor, or the like. When interchanging bipolar transistors with field effect transistors, it should be noted that for a field effect transistor, a gate electrode serves as a control electrode of the transistor, a source electrode and a drain electrode serve as two current conducting electrodes; for a bipolar transistor, a base electrode serves as a control electrode of the transistor, an emitter electrode and a collector electrode serve as two current conducting electrodes.

In operation, a load is connected to clamp circuit 10 via bond pad 23. FIG. 1 illustrates an inductive load 29 such as, for example, a solenoid, connected to bond pad 23 and to a node 31 for receiving a reference potential such as, for example, a supply voltage of $V_{DD}$. FET 18 is a conductive state when no external signal is applied to probe pad 25. Switch 26 is open when power MOSFET 12 is placed in a conductive state by a control signal applied to node 38. When a control signal place power MOSFET 12 in an inactive state and closes switch 26, the inductive energy stored in inductive load 29 raises the drain voltage of power MOSFET 12 above the supply voltage, $V_{DD}$. When the drain voltage of power MOSFET 12 reaches a clamping voltage, a current flows through clamping element 30 and current switch 27. This current develops a voltage across the gate and source electrodes of power MOSFET 12 and switches power MOSFET 12 into a conduction mode. Power MOSFET 12 remains in an active state until the inductive energy is dissipated. The clamping voltage ($V_{clamp}$) is defined as the summation of the total avalanche voltage of the Zener diodes in clamping element 30, the voltage across the blocking diode in clamping element 30, the voltage across the drain and source electrodes of FET 18, and the voltage across current switch 27.

Operation of clamp circuit 10 in a safe operating area is accomplished by maintaining $V_{clamp}$ less than the breakdown voltage ($BV_{dss}$) of power MOSFET 12. To ensure the safe operating area for clamp circuit 10, $V_{clamp}$ and $BV_{dss}$ of power MOSFET 12 are measured, and circuit die which do not satisfy the relation $V_{clamp} < BV_{dss}$ are discarded. $BV_{dss}$ is measured by applying a probe signal such as, for example, the supply voltage $V_{DD}$, to probe pad 25, thereby placing FET 18 in a nonconductive state. A predetermined current is transmitted through bond pad 23. The predetermined current should be above the leakage current of power MOSFET 12 and below a current value that will damage power MOSFET 12. The nonconductive FET 18 forces the predetermined current to flow through power MOSFET 12, which is in an inactive state. The voltage at bond pad 23 relative to node 11 is measured. An absolute value of the measured voltage is defined as the breakdown voltage ($BV_{dss}$) of power MOSFET 12. $V_{clamp}$ is measured by removing the probe signal applied to probe pad 25, thereby allowing resistor 21 to pull node 32 to the same potential level as node 11 and switching on FET 18. The conductive FET 18 steers a portion of the predetermined current transmitted through bond pad 23 into clamping element 30 and current switch 27. This portion of the predetermined current develops a voltage across the gate and source electrodes of power MOSFET 12. When the gate-source voltage of power MOSFET 12 exceeds the threshold voltage of power MOSFET 12, power MOSFET 12 becomes conductive. The remaining portion of the predetermined current flows through power MOSFET 12, which is now in the conduction mode. A voltage at bond pad 23 relative to reference potential 11 is measured. An absolute value of the measured voltage is defined as the clamp voltage ($V_{clamp}$). $BV_{dss}$ and $V_{clamp}$ are compared with each other. Those circuit die with $V_{clamp}$ less than $BV_{dss}$ by at least a predetermined nonnegative voltage are identified as operating in a safe operating area.

Figure 2:
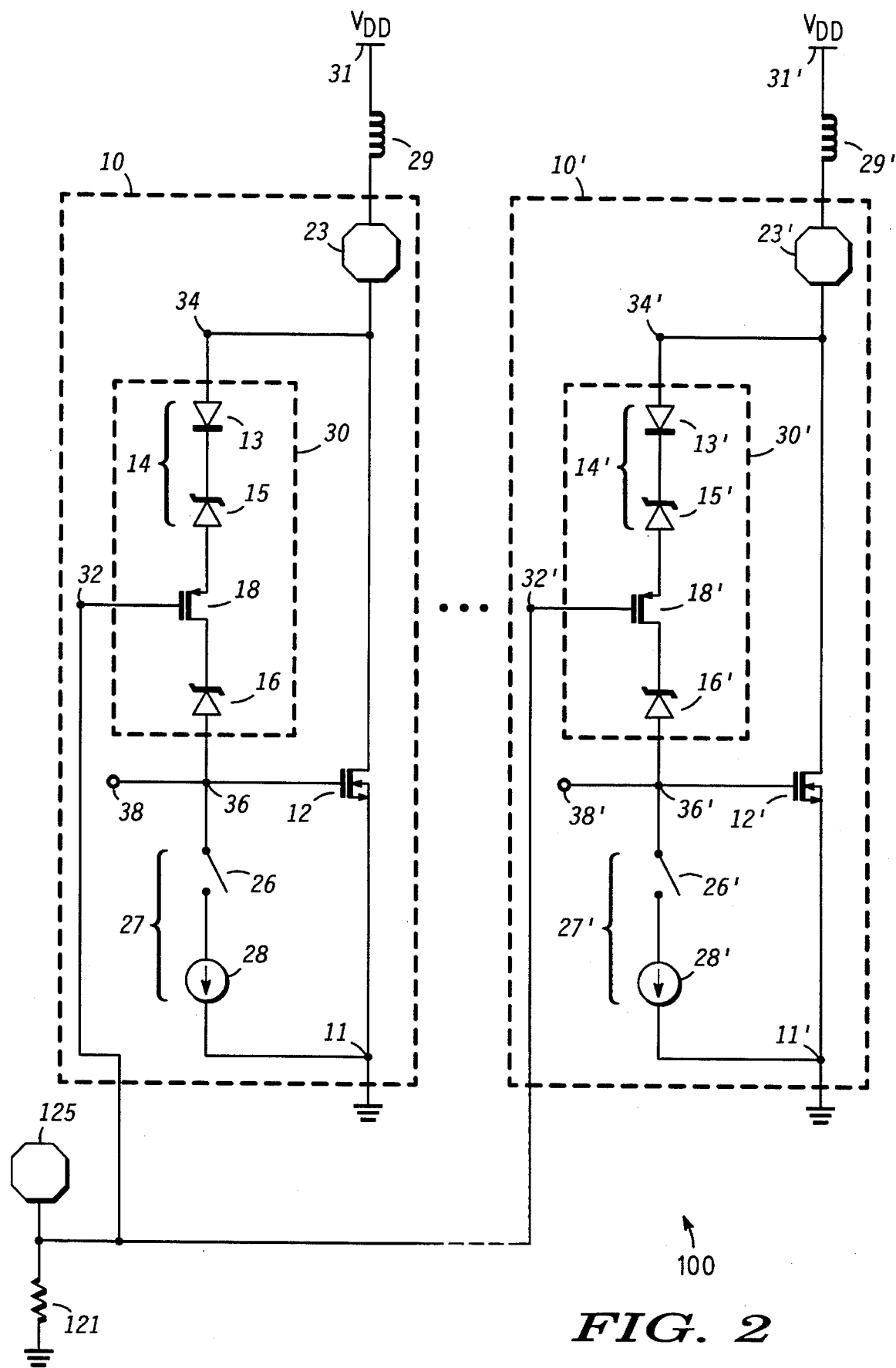
FIG. 2 illustrates a schematic diagram of a plurality of clamp circuits sharing one probe pad in accordance with a second embodiment of the present invention.

FIG. 2 illustrates a schematic diagram of a circuit 100 in accordance with a second embodiment of the present invention. Circuit 100 comprises a probe pad 125, a probe resistor 121, and a plurality of clamp circuit elements. Each clamping circuit element in circuit 100 has the same structure as clamp circuit 10 of FIG. 1 and provides protection for a transistor. It should be noted that the same reference numerals are used in FIG. 1 and FIG. 2 to denote the same elements. For example, the protection of a MOSFET 12 is provided by a clamp circuit element 10, comprised of MOSFET 12, a diode combination 14, a Zener diode 16, a FET 18, a bond pad 23, and a current switch 27. A load such as, for example, an inductive load 29, is connected to clamp circuit element 10 via bond pad 23. Likewise, the protection of a MOSFET 12' is provided by a clamp circuit element 10' comprised of MOSFET 12', a diode combination 14', a Zener diode 16', a FET 18', a bond pad 23', and a current switch 27'. A load such as, for example, an inductive load 29', is connected to clamp circuit element 10' via bond pad 23'. Both clamp circuit elements 10 and 10' in circuit 100 share one probe pad 125 and one probe resistor 121. It should be noted that the number of clamp circuit elements in circuit 100 is not limited to that depicted in FIG. 2. Any number of clamp circuit elements with the same structure as either clamp circuit element can be added to circuit 100 without additional probe pads and probe resistors.

In operation, probe pad 125 is pulled to the same potential level as node 11 by resistor 121, FET 18 and FET 18' are conductive, and MOSFET 12 and MOSFET 12' receive control signals through a node 38 and a node 38', respectively. When measuring the breakdown voltages of MOSFET 12 and MOSFET 12'. a probe voltage such as, for example, a supply voltage of $V_{DD}$, is applied to probe pad 125 to switch off FET 18 and FET 18'. The breakdown voltage of MOSFET 12 and MOSFET 12' can now be measured from bond pad 23 and bond pad 23', respectively. The clamp voltages of clamp circuit element 10 and clamp circuit element 10' can be measure from bond pads 23 and 23', respectively, by removing the probe voltage applied to probe pad 125. A safe operating area of circuit 100 is ensured when a safe operating area of each clamp circuit element in circuit 100 is ensured by comparing its clamp voltage and its breakdown voltage.

By now, it should be appreciated that a method for ensuring a safe operating area for a clamp circuit has been provided. The present invention achieves the measurement of the breakdown voltage of a transistor in a clamp circuit by adding a p-channel enhancement mode insulated gate field effect transistor, a probe pad, and a probe resistor, to a conventional clamp circuit. The clamp circuits in accordance with the present invention are easily expandable with a high area efficiency by adding a single p-channel enhancement mode insulated gate FET for each additional clamp circuit element. The present invention allows the measurement of the transistor breakdown voltage with the clamp intact, so that the transistor is constantly protected. Furthermore, the clamp circuits in accordance with the present invention do not need any post processing such as, for example, trimming, fusing, or wire bonding.

We claim:

1. A clamp circuit, comprising:
    a transistor having a control electrode, a first current conducting electrode, and a second current conducting electrode, wherein the control electrode is coupled for receiving a control signal;
    a first pad coupled to the second current conducting electrode of the transistor;
    a clamping element having a control terminal, a first clamping terminal, and a second clamping terminal, wherein the first clamping terminal is coupled to the first pad and the second clamping terminal is coupled to the control electrode of the transistor;
    a second pad coupled to the control terminal of the clamping element;
    a resistor having a first terminal and a second terminal, wherein the first terminal is coupled to the control terminal of the clamping element and the second terminal is coupled to the first current conducting electrode of the transistor; and
    a current switch having a first terminal and a second terminal, wherein the first terminal is coupled to the control electrode of the transistor and the second terminal is coupled to the first current conducting electrode of the transistor.

2. The clamp circuit of claim 1, wherein the transistor is a power metal oxide semiconductor field effect transistor.

3. The clamp circuit of claim 1, wherein the clamping element comprises:
    a switch having a control electrode, a first current conducting electrode, and a second current conducting electrode, wherein the control electrode is coupled to the control terminal of the clamping element;
    a blocking diode having an anode electrode and a cathode electrode, wherein the anode electrode is coupled to the first clamping terminal of the clamping element;
    a first Zener diode having an anode electrode and a cathode electrode, wherein the cathode electrode is coupled to the cathode electrode of the blocking diode and the anode electrode is coupled to the first current conducting electrode of the switch; and
    a second Zener diode having an anode electrode and a cathode electrode, wherein the cathode electrode is coupled to the second current conducting electrode of the switch and the anode electrode is coupled to the second clamping terminal of the clamping element.

4. The clamp circuit of claim 3, wherein the switch comprises a insulated gate field effect transistor.

5. The clamp circuit of claim 4, wherein the field effect transistor is a p-channel enhancement mode insulated gate field effect transistor.

6. The clamp circuit of claim 1, wherein the current switch comprises a switch and a current source.

7. A method for identifying a safe operating area for a clamp circuit, comprising the steps of:
    selecting a predetermined non-negative voltage;
    selecting a predetermined current;
    providing the clamp circuit including a transistor, a clamping element, and a current switch, wherein a control electrode of the transistor is coupled for receiving a control signal and coupled to a first current conducting electrode of the transistor via the current switch, a second current conducting electrode of the transistor is coupled to a first clamping terminal of clamping element, a control terminal of the clamping element is coupled for receiving a probe signal, and a second clamping terminal of the clamping element is coupled to the control electrode of the transistor;
    placing the clamping element in a non-conductive state between the first clamping terminal and the second clamping terminal by applying a first probe signal to the control terminal of the clamping element;
    placing the transistor in an inactive state by applying a first control signal to the control electrode of the transistor;
    measuring a first voltage across the second and first current conducting electrodes of the transistor while passing the predetermined current through the transistor from the second current conducting electrode to the first current conducting electrode;
    placing the clamping element in a conductive state between the first clamping terminal and the second clamping terminal by applying a second probe signal to the control terminal of clamping element;
    placing the transistor in an active state by passing a first portion of the predetermined current through the first and second clamping terminals of the clamping element, and the current switch;
    measuring a second voltage across the second and first current conducting electrodes of the transistor while passing a second portion of the predetermined current through the transistor from the second current conducting electrode to the first current conducting electrode;
    generating a difference voltage by subtracting an absolute value of the second voltage from an absolute value of the first voltage; and
    identifying the clamp circuit as operating in a safe operating area in response to the difference voltage equal to or greater than the predetermined non-negative voltage.

8. The method for identifying a safe operating area for a clamp circuit as claimed in claim 7, wherein the step of providing the clamp circuit includes providing the clamping element comprising a blocking diode, a first Zener diode, a second Zener diode, and a switch, wherein an anode electrode of the blocking diode is coupled to the first clamping terminal of the clamping element, a cathode electrode of the blocking diode is coupled to a cathode electrode of the first Zener diode, an anode electrode of the first Zener diode is coupled to a first current conducting electrode of the switch, a second current conducting electrode of the switch is coupled to a cathode electrode of the second Zener diode, an anode electrode of the second Zener diode is coupled to the second clamping terminal of the clamping element, and a control electrode of the switch is coupled to the control terminal of the clamping element.

9. The method for identifying a safe operating area for the clamp circuit as claimed in claim 8, wherein the step of providing a switch includes providing field effect transistor.

10. The method for identifying a safe operating area for the clamp circuit as claimed in claim 9, wherein the step of providing a field effect transistor includes providing a p-channel enhancement mode insulated gate field effect transistor.

11. The method for identifying a safe operating area for the clamp circuit as claimed in claim 7, where in the step of providing a clamp circuit further includes the steps of:

providing a probe pad and a resistor, wherein the probe pad is coupled to the control terminal of the clamping element and to the first current conducting electrode of the transistor via the resistor;

providing a bond pad coupled to the second current conducting electrode of the transistor; and coupling the first current conducting electrode of the transistor for receiving a reference potential.

12. The method for identifying a safe operating area for a clamp circuit as claimed in claim 11, where in the step of placing the clamping element in a non-conductive state includes applying a probe voltage to the probe pad.

13. The method for identifying a safe operating area for a clamp circuit as claimed in claim 12, where in the step of placing the clamping element in a conductive state includes removing the probe voltage applied to the probe pad.

14. The method for identifying a safe operating area for a clamp circuit as claimed in claim 11, where in the step of measuring a first voltage includes measuring the first voltage at the bond pad relative to the reference potential.

15. The method for identifying a safe operating area for a clamp circuit as claimed in claim 11, where in the step of measuring a second voltage includes measuring the second voltage at the bond pad relative to the reference potential.

* * * * *